(12) United States Patent
Ando

(10) Patent No.: US 12,244,955 B2
(45) Date of Patent: Mar. 4, 2025

(54) IMAGING ELEMENT AND IMAGING DEVICE

(71) Applicant: NIKON CORPORATION, Tokyo (JP)

(72) Inventor: Ryoji Ando, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/764,794

(22) PCT Filed: Sep. 30, 2020

(86) PCT No.: PCT/JP2020/037289
§ 371 (c)(1),
(2) Date: Mar. 29, 2022

(87) PCT Pub. No.: WO2021/066065
PCT Pub. Date: Apr. 8, 2021

(65) Prior Publication Data
US 2022/0337776 A1 Oct. 20, 2022

(30) Foreign Application Priority Data
Sep. 30, 2019 (JP) .................. 2019-180781

(51) Int. Cl.
*H04N 25/79* (2023.01)
*H04N 25/616* (2023.01)
*H04N 25/772* (2023.01)

(52) U.S. Cl.
CPC ........... *H04N 25/79* (2023.01); *H04N 25/616* (2023.01); *H04N 25/772* (2023.01)

(58) Field of Classification Search
CPC .... H04N 25/79; H04N 25/616; H04N 25/772; H04N 25/63; H04N 25/62; H04N 25/70;
(Continued)

(56) References Cited

U.S. PATENT DOCUMENTS

2004/0155973 A1 8/2004 Bea et al.
2006/0279650 A1 12/2006 Watanabe et al.
(Continued)

FOREIGN PATENT DOCUMENTS

| EP | 3 664 440 A1 | 6/2020 |
| JP | 2004-222273 A | 8/2004 |

(Continued)

OTHER PUBLICATIONS

Dec. 8, 2020 International Search Report issued in International Patent Application No. PCT/JP2020/037289.
(Continued)

*Primary Examiner* — Albert H Cutler
(74) *Attorney, Agent, or Firm* — Oliff PLC

(57) ABSTRACT

An imaging element includes a first substrate provided with a photoelectric conversion unit configured to generate electric charges by photoelectric conversion and a signal line to which a signal based on the electric charges generated by the photoelectric conversion unit is output and a second substrate provided with a supply unit configured to supply a voltage to the signal line so that a voltage of the signal line does not fall below a predetermined voltage and a processing unit configured to process a signal output to the signal line, the second substrate being stacked on the first substrate.

22 Claims, 6 Drawing Sheets

(58) Field of Classification Search
CPC .... H04N 25/60; H04N 25/621; H04N 25/623; H04N 25/627; H04N 25/709; H04N 25/76; H04N 25/766; H04N 25/77; H04N 25/778; H04N 25/78; H01L 27/14636; H01L 27/14634
See application file for complete search history.

(56) References Cited

U.S. PATENT DOCUMENTS

| | | | |
|---|---|---|---|
| 2008/0036890 A1* | 2/2008 | Yamashita | H04N 25/627 348/308 |
| 2017/0244844 A1 | 8/2017 | Miyoshi et al. | |
| 2018/0084206 A1 | 3/2018 | Saito et al. | |
| 2018/0098005 A1* | 4/2018 | Hanzawa | H04N 25/76 |
| 2018/0295274 A1 | 10/2018 | Nakayama et al. | |
| 2018/0376093 A1* | 12/2018 | Tsukuda | H01L 27/14612 |
| 2020/0035736 A1 | 1/2020 | Nagahama | |
| 2020/0244907 A1 | 7/2020 | Ueno et al. | |
| 2020/0252603 A1* | 8/2020 | Steadman | H04N 17/002 |

FOREIGN PATENT DOCUMENTS

| | | |
|---|---|---|
| JP | 2011-160046 A | 8/2011 |
| JP | 2013-141301 A | 7/2013 |
| JP | 2017-147663 A | 8/2017 |
| JP | 2018-046484 A | 3/2018 |
| JP | 2019-030002 A | 2/2019 |
| WO | 2016/158484 A1 | 10/2016 |
| WO | 2017/104765 A1 | 6/2017 |
| WO | 2018/186026 A1 | 10/2018 |

OTHER PUBLICATIONS

Dec. 8, 2020 Written Opinion issued in International Patent Application No. PCT/JP2020/037289.
May 9, 2023 Office Action issued in Japanese Patent Application No. 2021-551416.
Jul. 24, 2023 Office Action issued in Chinese Patent Application No. 202080067533.5.
Nov. 5, 2024 Office Action issued in Japanese Patent Application No. 2023-190000.

* cited by examiner

IMAGING ELEMENT AND IMAGING DEVICE

TECHNICAL FIELD

The present invention relates to an imaging element and an imaging device.

BACKGROUND ART

An imaging element in which one transistor for clamping a signal that is output from a pixel at a predetermined voltage level is provided for each column is known (Patent Literature 1). Since the past, improvements in the quality of images have been required.

CITATION LIST

Patent Literature

[Patent Literature 1]
Japanese Unexamined Patent Application, First Publication No. 2004-222273

SUMMARY OF INVENTION

According to a first aspect, there is provided an imaging element including a first substrate provided with a photoelectric conversion unit configured to generate electric charges by photoelectric conversion and a signal line to which a signal based on the electric charges generated by the photoelectric conversion unit is output and a second substrate provided with a supply unit configured to supply a voltage to the signal line so that a voltage of the signal line does not fall below a predetermined voltage and a processing unit configured to process a signal output to the signal line, the second substrate being stacked on the first substrate.

According to a second aspect, there is provided an imaging device including the imaging element according to the first aspect and a generation unit configured to generate image data on the basis of a signal processed by the processing unit.

DESCRIPTION OF EMBODIMENTS

First Embodiment

Figure 1:
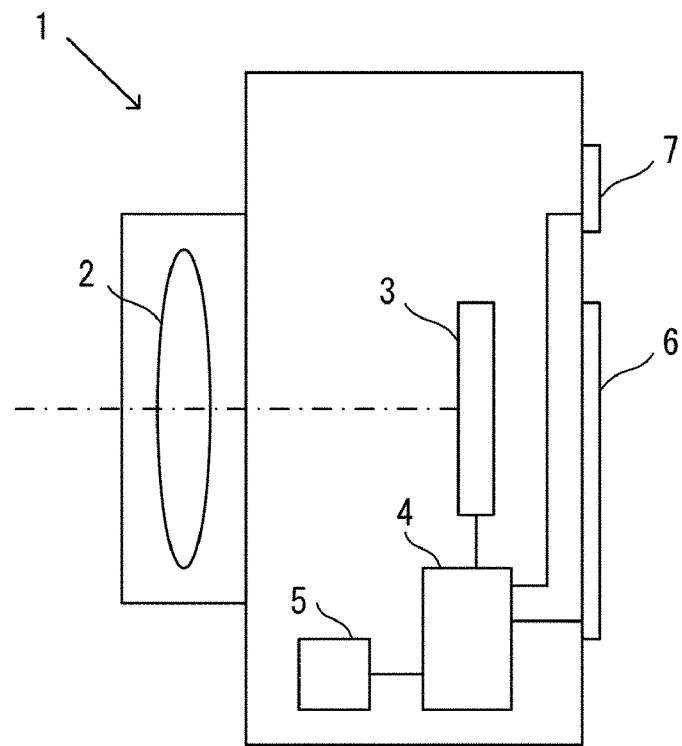
FIG. 1 is a diagram illustrating a configuration example of an imaging device according to a first embodiment.

FIG. 1 is a diagram illustrating a configuration example of a camera 1 which is an example of an imaging device according to a first embodiment. The camera 1 includes an imaging optical system (imaging optical system) 2, an imaging element 3, a control unit 4, a memory 5, a display unit 6, and an operation unit 7. The imaging optical system 2 has a plurality of lenses including a focus adjustment lens (focusing lens) and an aperture diaphragm, and forms a subject image on the imaging element 3. Meanwhile, the imaging optical system 2 may be detachable from the camera 1.

The imaging element 3 is an imaging element such as a CMOS image sensor or a CCD image sensor. The imaging element 3 receives a flux of light that has passed through the imaging optical system 2 and captures a subject image formed by the imaging optical system 2. A plurality of pixels having a photoelectric conversion unit are disposed in the imaging element 3 two-dimensionally (in a row direction and a column direction). The photoelectric conversion unit is constituted by a photodiode (PD). The imaging element 3 photoelectrically converts the received light to generate a signal, and outputs the generated signal to the control unit 4.

The memory 5 is a recording medium such as a memory card. Image data, a control program, and the like are recorded in the memory 5. Writing of data to the memory 5 and reading of data from the memory 5 are controlled by the control unit 4. The display unit 6 displays an image based on image data, information relating to shooting such as a shutter speed or an aperture value, a menu screen, and the like. The operation unit 7 includes various setting switches and the like such as a release button, a power-supply switch, and a switch for switching various modes, and outputs a signal based on each operation to the control unit 4.

The control unit 4 is constituted by processors such as a CPU, an FPGA, and an ASIC, and memories such as a ROM and a RAM, and controls each unit of the camera 1 on the basis of a control program. The control unit 4 supplies a signal for controlling the imaging element 3 to the imaging element 3 to control the operation of the imaging element 3. The control unit 4 causes the imaging element 3 to capture a subject image and output a signal in a case where a still image is captured, a case where a moving image is captured, a case where a through image (live view image) of a subject is displayed on the display unit 6, or the like.

The control unit 4 performs various types of image processing on a signal which is output from the imaging element 3 to generate image data. The control unit 4 is also a generation unit 4 that generates image data, and generates still image data and moving image data on the basis of the signal which is output from the imaging element 3. The image processing includes image processing such as a gradation conversion process or a color interpolation process.

Figure 2:
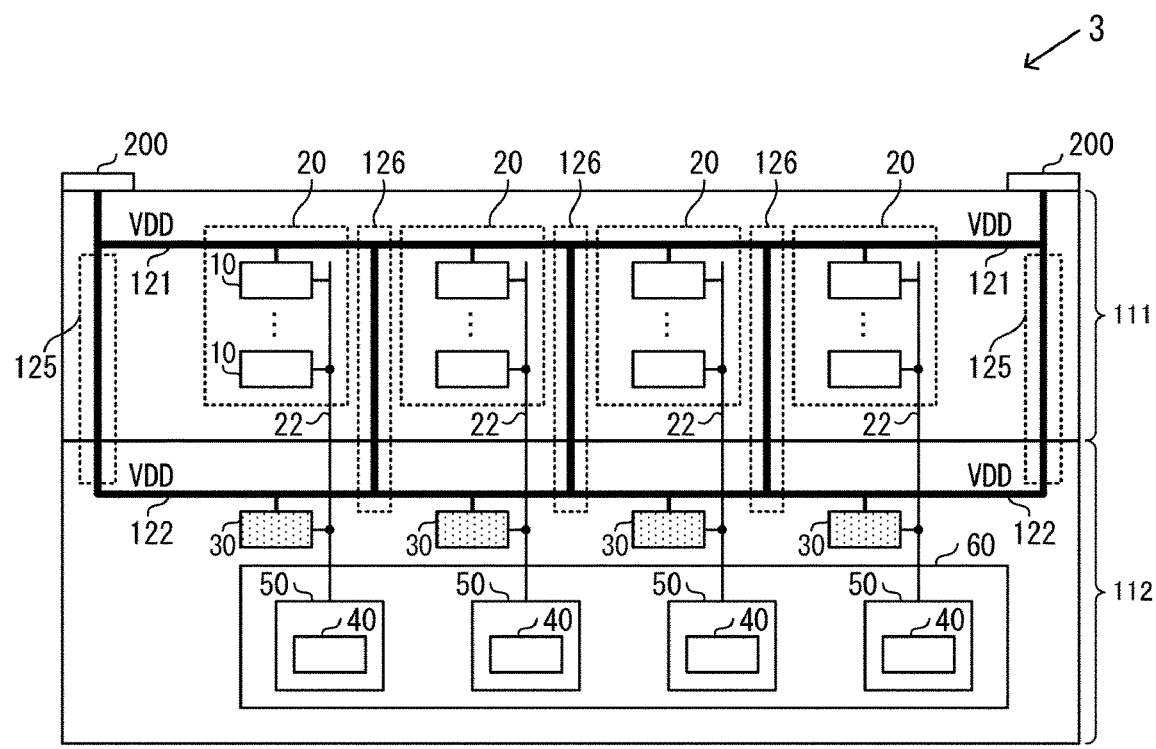
FIG. 2 is a block diagram illustrating a configuration example of an imaging element according to the first embodiment.

FIG. 2 is a block diagram illustrating a configuration example of the imaging element according to the first embodiment. The imaging element 3 is configured by stacking a first substrate 111 provided with a plurality of pixels 10 and a second substrate 112 provided with supply units 30 and a readout unit 60. The first substrate 111 and the second substrate 112 are each configured using a semiconductor substrate. Circuits provided in the first substrate 111 and circuits provided in the second substrate 112 are electrically connected to each other by connecting portions such as electrodes or bumps.

The first substrate 111 has a plurality of regions 20 in which the plurality of pixels 10 are disposed. In the example shown in FIG. 2, four regions 20 are shown. Each of these four regions 20 indicates one region when a region in which the pixels 10 in the first substrate 111 are disposed is divided into regions including a predetermined number of pixels. Meanwhile, the regions 20 may partially overlap each other, or may not overlap each other. The number of pixels in each region 20 may be 4 pixels of 2 pixels×2 pixels, may be 16 pixels of 4 pixels×4 pixels, or may be any number. Hereinafter, the region 20 is referred to as a pixel block 20.

The imaging element 3 is provided with a signal line 22 and a supply unit 30 to be described later for each pixel block 20. In addition, as will be described later, the imaging element 3 is provided with a pixel control unit and a supply control unit for each pixel block 20. The signal line 22 is a signal line that connects the pixel block 20 and the readout unit 60, and a signal is output from the pixel 10. The signal line 22 is a signal line using a connecting portion such as an electrode or a bump.

The readout unit 60 has processing units 50 including an analog/digital conversion unit (AD conversion unit) 40. The processing unit 50 is provided for each pixel block 20. In the imaging element 3 according to the present embodiment, the signal line 22 provided in each of the pixel blocks 20 is used to read out signals of pixels from a plurality of pixel blocks 20 in parallel. The readout unit 60 causes the processing unit 50 provided for each pixel block 20 to output the signal of the pixel of each pixel block 20 simultaneously (in parallel), and thus each processing unit 50 can perform signal processing on the signal of the pixel simultaneously. Since each processing unit 50 performs signal processing on the signal output from each pixel block 20 simultaneously, the readout unit 60 can perform high-speed signal processing.

The AD conversion unit 40 of the processing unit 50 converts a pixel signal which is an analog signal input from each pixel 10 of the pixel block 20 through the signal line 22 into a digital signal. Meanwhile, the processing unit 50 may have an amplifier unit that amplifies the pixel signal input through the signal line 22 with a predetermined gain (amplification factor). In this case, the AD conversion unit 40 converts the pixel signal amplified by the amplifier unit into a digital signal.

The pixel signal converted into a digital signal is output to the control unit 4 of the camera 1 after the processing unit 50 performs signal processing such as correlated double sampling (CDS) or processing of correcting a signal amount. Meanwhile, signal processing such as correlated double sampling with respect to the pixel signal may be performed in a signal processing unit (not shown). In this case, the processing unit 50 outputs the pixel signal converted into a digital signal by the AD conversion unit 40 to the signal processing unit. The signal processing unit performs signal processing such as correlated double sampling on the input pixel signal, and then outputs the processed pixel signal to the control unit 4.

A plurality of electrodes (pads) 200 to which a power supply voltage VDD is supplied (applied) are provided around a region in which each pixel 10 is disposed in the first substrate 111. The electrode 200 is connected to the plurality of pixels 10 disposed in the first substrate 111 through a wiring 121. The pixel 10 is supplied with the power supply voltage VDD through the wiring 121.

In addition, the imaging element 3 is provided with wirings 125 and wirings 126 as schematically shown in FIG. 2. The wiring 125 is a wiring that penetrates through the first substrate 111. The wiring 126 is a wiring that connects the wiring 121 of the first substrate 111 and a wiring 122 of the second substrate 112. The wiring 125 and the wiring 126 are formed using electrodes, bumps, and the like. The electrode 200 is connected to a plurality of supply units 30 disposed in the second substrate 112 through the wiring 125 and the wiring 122. In addition, the electrode 200 is connected to the plurality of supply units 30 through the wiring 121, the wiring 126, and the wiring 122. The supply unit 30 is supplied with the power supply voltage VDD through the wiring 125 and the wiring 122, and is supplied with the power supply voltage VDD through the wiring 121 and the wiring 126. The electrode 200 is an electrode common to the plurality of pixels 10 and the supply unit 30, and is disposed on one surface of the first substrate 111 as shown in FIG. 2.

Hereinafter, the configuration of the imaging element 3 according to the present embodiment will be further described with reference to the drawings.

Figure 3:
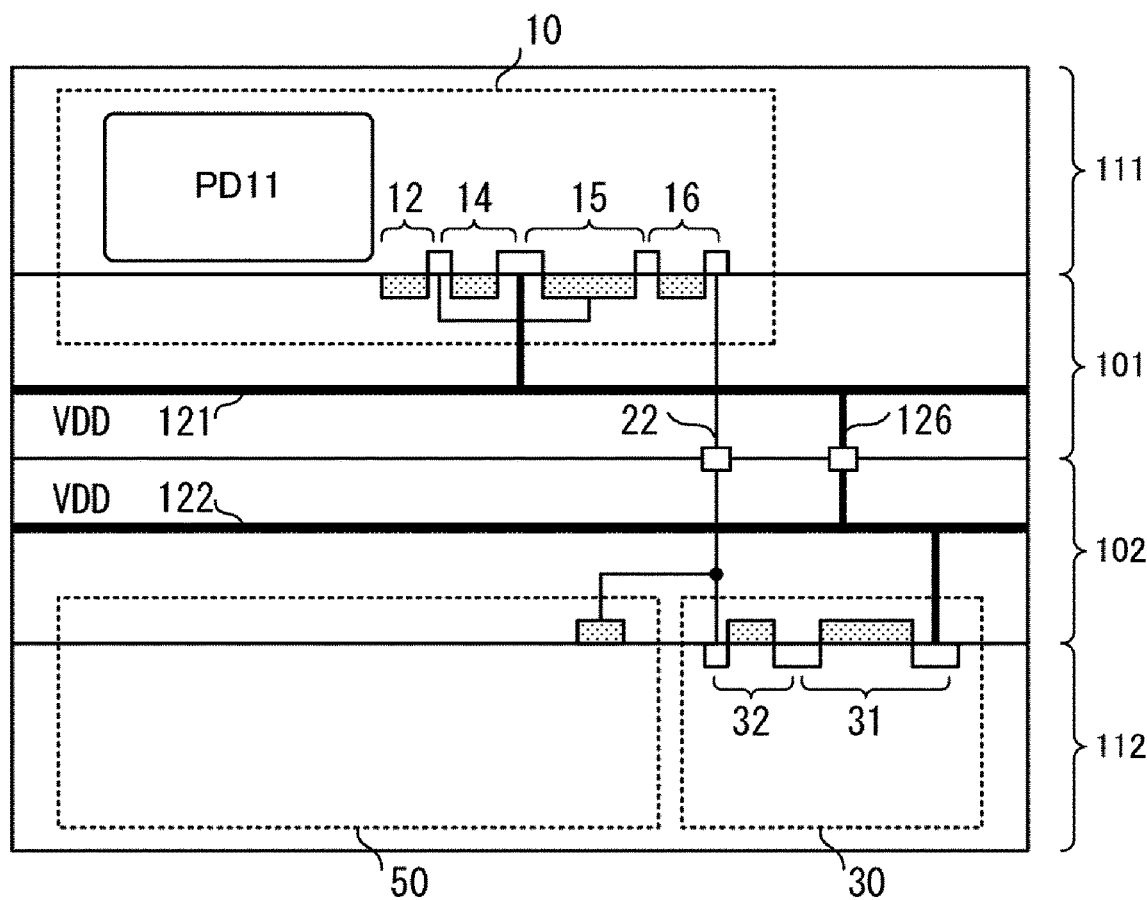
FIG. 3 is a diagram illustrating an example of a cross-sectional structure of a portion of the imaging element according to the first embodiment.
Figure 4:
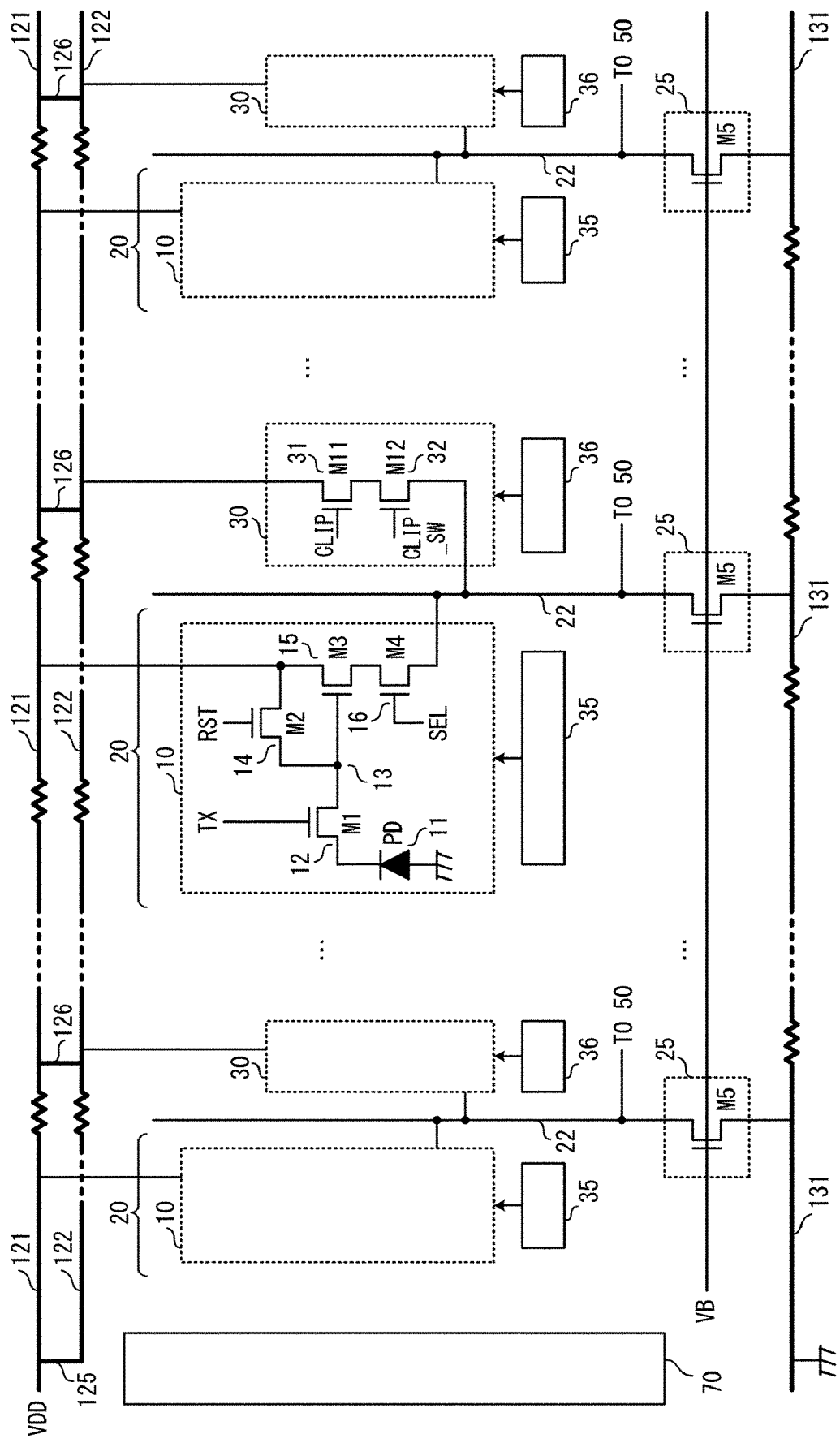
FIG. 4 is a diagram illustrating a configuration example of a portion of the imaging element according to the first embodiment.

FIG. 3 is a diagram illustrating an example of a cross-sectional structure of a portion of the imaging element according to the first embodiment. FIG. 4 is a diagram illustrating a configuration example of a portion of the imaging element according to the first embodiment. The imaging element 3 shown in FIG. 3 is a back-side illuminated imaging element. The imaging element 3 includes the first substrate 111, a wiring layer 101 stacked on the first substrate 111, the second substrate 112, and a wiring layer 102 stacked on the second substrate 112. The wiring layer 101 and the wiring layer 102 are wiring layers including a conductor film (metal film) and an insulating film, respectively, and have a plurality of wirings, vias, insulating interlayers, and the like disposed therein.

Light from a subject is incident in the positive direction of the Z axis in FIG. 3. In addition, as shown in the coordinate axes in FIG. 3, the right direction of the page orthogonal to the Z axis is defined as the positive direction of the X axis, and the forward direction of the page orthogonal to the Z axis and the X axis is defined as the positive direction of the Y axis. In the following drawings, the coordinate axes may be displayed with the coordinate axes in FIG. 3 as a reference so that the orientation of each drawing can be understood. In the first substrate 111 and the wiring layer 101, a plurality of pixel blocks 20 including a plurality of pixels 10 are disposed in the X-axis direction and the Y-axis direction. In the second substrate 112 and the wiring layer 102, a plurality of supply units 30 and a plurality of processing units 50 are disposed in the X-axis direction and the Y-axis direction. In the imaging element 3, the wiring 126 is provided between the pixel 10 and the supply unit 30. It can be said that the wiring 126 is provided between a photoelectric conversion unit 11 and the supply unit 30. In the example shown in FIG. 3, the wiring 126 is disposed parallel to the signal line 22.

FIG. 4 shows some pixels 10 among the plurality of pixels 10 provided in the imaging element 3, some current sources 25 and supply units 30, some pixel control units 35 and supply control units 36, and a readout control unit 70. The current sources 25 and the supply units 30 are provided for the signal lines 22. The pixel control units 35 and the supply control units 36 are disposed for each pixel block 20.

Meanwhile, in FIG. 4, for the purpose of simplification of the drawing, only one pixel 10 is shown for each pixel block 20.

The pixel 10 has the photoelectric conversion unit 11, a transfer unit 12, a floating diffusion (FD) 13, a reset unit 14, an amplification unit 15, and a selection unit 16. The photoelectric conversion unit 11 is a photodiode PD, which converts incident light into electric charges and accumulates photoelectrically converted electric charges.

The transfer unit 12 is constituted by a transistor M1 controlled by a signal TX, and transfers the electric charges photoelectrically converted by the photoelectric conversion unit 11 to the FD 13. The transistor M1 is a transfer transistor. The FD 13 accumulates (holds) the electric charges transferred to the FD 13 and converts them into a voltage divided by a capacity value. The FD 13 is an accumulation unit 13 and accumulates the electric charges generated by the photoelectric conversion unit 11.

The amplification unit 15 is constituted by a transistor M3 of which the gate (terminal) is connected to the FD 13, and amplifies and outputs a signal caused by the electric charges accumulated in the FD 13. The drain (terminal) of the transistor M3 is connected to the electrode 200 (see FIG. 2) through the wiring (power supply line) 121 and is supplied with the power supply voltage VDD. The source (terminal) of the transistor M3 is connected to the signal line 22 through the selection unit 16. The amplification unit 15 functions as a portion of a source follower circuit using the current source 25 as a load current source. The transistor M3 is an amplification transistor. The amplification unit 15 and the selection unit 16 constitute an output unit that generates and outputs a signal based on the electric charges generated by the photoelectric conversion unit 11.

The reset unit 14 is constituted by a transistor M2 controlled by a signal RST, and electrically connects or disconnects the FD 13 and the power supply line 121. The reset unit 14 resets the electric charges accumulated by the FD 13. The reset unit 14 discharges the electric charges accumulated in the FD 13 to reset the voltage of the FD 13. The transistor M2 is a reset transistor. The selection unit 16 is constituted by a transistor M4 controlled by a signal SEL, and electrically connects or disconnects the amplification unit 15 and the signal line 22. The transistor M4 of the selection unit 16 outputs a signal from the amplification unit 15 to the signal line 22 in a case where it is in an on state. The transistor M4 is a selection transistor.

The current source 25 is configured to include a transistor M5 in which a signal VB is input to its gate. The current source 25 is connected to each pixel 10 of the pixel block 20 and the supply unit 30 through the signal line 22. The current source 25 generates a current on the basis of the signal level of the signal VB, and supplies the generated current to the signal line 22, the pixel 10, and the supply unit 30. Meanwhile, the current source 25 may be constituted by two transistors on which cascode connection is performed. The signal VB is generated by a signal generation unit (not shown). The signal generation unit is commonly connected to the current source 25 provided for each signal line 22, and supplies the signal VB to each current source 25. The gates of the transistors M5 of the current sources 25 are electrically connected to each other, and the signal VB is input from the signal generation unit.

A signal when the voltage of the FD 13 is reset (dark signal) and a signal based on the electric charges transferred from the photoelectric conversion unit 11 to the FD 13 by the transfer unit 12 (photoelectric conversion signal) are sequentially output to the signal line 22. The dark signal is used to remove noise contained in the photoelectric conversion signal. The dark signal can be said to be an analog signal indicating a reference level for the photoelectric conversion signal, and is used to correct the photoelectric conversion signal. The photoelectric conversion signal is an analog signal which is generated on the basis of the electric charges photoelectrically converted by the photoelectric conversion unit 11. The dark signal and the photoelectric conversion signal are input to the processing unit 50 (see FIG. 2) of the readout unit 60 through the signal line 22. In the present embodiment, the processing unit 50 has a calculation unit that subtracts the photoelectric conversion signal and the dark signal, performs CDS based on the subtraction of the photoelectric conversion signal and the dark signal, and removes a noise component from the photoelectric conversion signal.

The supply unit 30 has a signal output unit 31 and a switch unit 32 as shown in FIG. 4, and has a function of supplying a voltage to the signal line 22. The signal output unit 31 is constituted by a transistor M11 in which a signal CLIP is input to its gate, and generates and outputs a signal having a voltage level based on the signal CLIP. The drain of the transistor M11 is connected to the electrode 200 (see FIG. 2) through the power supply line 122, and is supplied with the power supply voltage VDD. The source of the transistor M11 is connected to the signal line 22 through the switch unit 32.

The switch unit 32 is constituted by a transistor M12 controlled by a signal CLIP_SW, and electrically connects or disconnects the signal output unit 31 and the signal line 22. In a case where the transistor M12 of the switch unit 32 is in an on state, the transistor can output a signal from the signal output unit 31 to the signal line 22. In the present embodiment, in a case where the switch unit 32 is in an on state, the voltage (potential) of the signal line 22 is limited by the signal output unit 31 so as to be a value within a range in which the voltage based on the signal CLIP is set to a lower limit. The supply unit 30 supplies a voltage to the signal line 22 so that the voltage of the signal line 22 does not fall below a predetermined voltage. It can be said that the supply unit 30 is a limitation unit 30 that limits the voltage of the signal line 22. It can be said that the supply unit 30 supplies a voltage to the signal line 22 so that the voltage of the signal line 22 is set to a value from the power supply voltage VDD to the voltage based on the signal CLIP, and controls (adjusts) the voltage of the signal line 22.

The pixel control unit 35 is configured to include a switch and a buffer, and is controlled by the readout control unit 70. The pixel control unit 35 supplies signals such as the signal TX, the signal RST, and the signal SEL described above to the pixels 10 of the pixel block 20, and controls the operation of each pixel 10. The pixel control unit 35 supplies a signal to the gate of each transistor of the pixel 10, and brings the transistor into an on state (a connected state, an electrical conducting state, or a short-circuited state) or an off state (a disconnected state, a non-electrical conducting state, an open state, or a cut-off state).

The readout control unit 70 and the pixel control unit 35 control the signal TX, the signal SEL, and the like which are input to the pixel 10 to thereby control a period in which charges are accumulated in the pixel block 20 and a timing at which a pixel signal is read out. The pixel control unit 35 provided for each pixel block 20 can control the pixel 10 so that charge accumulation times differ for each pixel block 20, or can control the pixel 10 so that the charge accumulation times are the same for all the pixel blocks 20. In addition, each pixel control unit 35 can control the pixel 10 so that timings at which the pixel signal is read out differ for each pixel block 20, or can control the pixel 10 so that the timings at which the pixel signal is read out are the same for all the pixel blocks 20. The pixel control unit 35 controls the pixel 10 so that the charge accumulation times differ for each pixel block 20, and thus can capture an image in accordance with the brightness of each subject even when there are a plurality of subjects. In addition, the pixel control unit 35 controls the pixel 10 so that the timings at which the pixel signal is read out differ for each pixel block 20, and thus can capture an image in accordance with the moving speed of each subject even when there are a plurality of subjects.

The supply control unit 36 is configured to include a switch and a buffer, and is controlled by the readout control unit 70. As described above, the pixel control unit 35 can control the pixel 10 so that the charge accumulation times differ for each pixel block 20, and can control the pixel 10 so that the timings at which the pixel signal is read out differ for each pixel block 20. In that case, since timings at which a signal is output to the signal line 22 differ for each block 20, the supply control unit 36 has to control the operation of each switch unit 32 for each pixel block 20. The supply control unit 36 supplies the above-described signal CUP SW to the switch unit 32 of the pixel block 20 to control the operation of each switch unit 32. The supply control unit 36 performs on/off control on the switch unit 32 to start and stop the supply of a voltage from the signal output unit 31 to the signal line 22. In the present embodiment, the supply control unit 36 provided for each pixel block 20 adjusts a timing at which a voltage is supplied from the signal output unit 31 to the signal line 22 on the basis of the timings at which the dark signal and the photoelectric conversion signal are read out in the pixel block 20. For example, the supply control unit 36 provided for each pixel block 20 controls the switch unit 32 so that a voltage can be supplied to the signal line 22 provided for a certain pixel block 20 and the signal line 22 provided for another pixel block 20 at different timings. Meanwhile, each supply control unit 36 may control each switch unit 32 so that a voltage can be supplied to all the pixel blocks 20 at the same timing.

The readout control unit 70 is commonly provided in a plurality of pixel blocks 20. The readout control unit 70 is constituted by a plurality of circuits including a timing generator, and is disposed in the second substrate 112. The readout control unit 70 is controlled by the control unit 4 of the camera 1. The readout control unit 70 controls the operation of the pixel 10 by controlling signals such as the signal TX, the signal RST, and the signal SEL which are input to the pixel 10 through the pixel control unit 35. In addition, the readout control unit 70 controls the operation of the supply unit 30 by controlling the signal CLIP_SW which is input to the supply unit 30 through the supply control unit 36.

Meanwhile, the above-described supply control unit 36 is disposed in the second substrate 112. The pixel control unit 35 may be disposed in either the first substrate 111 or the second substrate 112, or may be disposed separately in the first substrate 111 and the second substrate 112. The pixel control unit 35 may be disposed in a substrate different from the first substrate 111 and the second substrate 112. The readout control unit 70 may be disposed separately in the first substrate 111 and the second substrate 112, or may be disposed in the first substrate 111. The readout control unit 70 may be disposed in a substrate different from the first substrate 111 and the second substrate 112.

The selection unit 16 of the pixel 10 and the switch unit 32 of the supply unit 30 enter an on state, and thus the source of the amplification unit 15 and the source of the signal output unit 31 are electrically connected to the signal line 22. In this case, a path through which a current flows due to the current source 25 connected to the signal line 22 changes on the basis of the magnitude relation between the voltage of the gate of the amplification unit 15 (that is, the voltage of the FD 13) and the voltage of the gate of the supply unit 30 (that is, the voltage of the signal CLIP).

In a case where the voltage of the FD 13 is higher than the voltage of the signal CLIP, the current of the current source 25 flows mainly to the amplification unit 15 through the signal line 22 and the selection unit 16. The amplification unit 15 outputs a signal based on the voltage of the FD 13 to the signal line 22. Thereby, the voltage of the signal line 22 becomes a voltage corresponding to the voltage of the FD 13. In a case where the voltage of the FD 13 is lower than the voltage of the signal CLIP, the current of the current source 25 flows mainly to the signal output unit 31 through the signal line 22 and the switch unit 32. In this case, the signal output unit 31 outputs a signal based on the voltage of the signal CLIP to the signal line 22 to thereby limit the voltage of the signal line 22 to a voltage based on the voltage of the signal CLIP. The voltage of the signal line 22 becomes a voltage corresponding to the voltage of the signal CLIP.

In this way, in a case where the switch unit 32 is in an on state, the supply unit (limitation unit) 30 limits the voltage of the signal line 22 in accordance with the voltage of the FD 13 and the voltage of the signal CLIP. The transistor M1*l* of the supply unit 30 is a transistor that limits (clips) the voltage of the signal line 22, and may be referred to as a clip transistor or a clamp transistor. In a case where the voltage of the FD 13 is relatively low, the voltage of the signal line 22 is limited to a voltage based on the signal CLIP. This makes it possible to prevent the current source 25 from not normally operating due to a decrease in the voltage of the signal line 22. As a result, it is possible to prevent the current of the current source 25 from not being supplied. In addition, it is possible to prevent the voltage of the signal line 22 from being input to the readout unit 60 due to changing to a voltage outside an expected range.

In addition, in the imaging element 3 according to the present embodiment, the signal CLIP having a different signal level is input to the supply unit 30 in a case where the dark signal is read out and a case where the photoelectric conversion signal is read out. Thereby, the supply unit 30 can supply a different voltage to the signal line 22 in a case where the dark signal is read out and a case where the photoelectric conversion signal is read out.

In a case where the dark signal is read out, the first voltage V1 is supplied to the gate of the transistor M1*l* of the signal output unit 31. In this case, the voltage of the signal line 22 is limited so that a voltage based on the first voltage V1 is set to a lower limit Thereby, the voltage of a signal which is output to the readout unit 60 as the dark signal is limited. In a case where the photoelectric conversion signal is read out, a second voltage V2 lower than the first voltage V1 is supplied to the gate of the transistor M11. In this case, the voltage of the signal line 22 is limited so that a voltage based on the second voltage V2 is set to a lower limit Thereby, the voltage of a signal which is output to the readout unit 60 as the photoelectric conversion signal is limited.

Electric charges may be accumulated in the FD 13 due to pixel defects, and the voltage of the dark signal may decrease. When an image of a high-luminance subject is captured, electric charges may be accumulated in the FD 13 to cause a decrease in the voltage of the dark signal. In such a case, a difference between the dark signal and the photoelectric conversion signal becomes small, and the quality of an image generated using a signal after CDS processing may be deteriorated. In the present embodiment, it is possible to secure a difference between the signal level of the dark signal and the signal level of the photoelectric conversion signal by limiting the voltage of the dark signal as described above. Therefore, it is possible to prevent the quality of an image from being deteriorated due to a small difference between the dark signal and the photoelectric conversion signal.

The above-described second voltage V2 is determined so that the voltage of the signal line 22 does not drop below a voltage required for the operation of the transistor M5 of the current source 25 and that the voltage of the signal line 22 can be as low as possible. This makes it possible to prevent a change in the voltage of the signal line 22 occurring in a case where the electric charges generated by the photoelectric conversion unit 11 are transferred to the FD 13 from being hindered. In addition, it is possible to prevent the current of the current source 25 from fluctuating and to prevent noise from being mixed in the photoelectric conversion signal which is output to the signal line 22.

Figure 5:
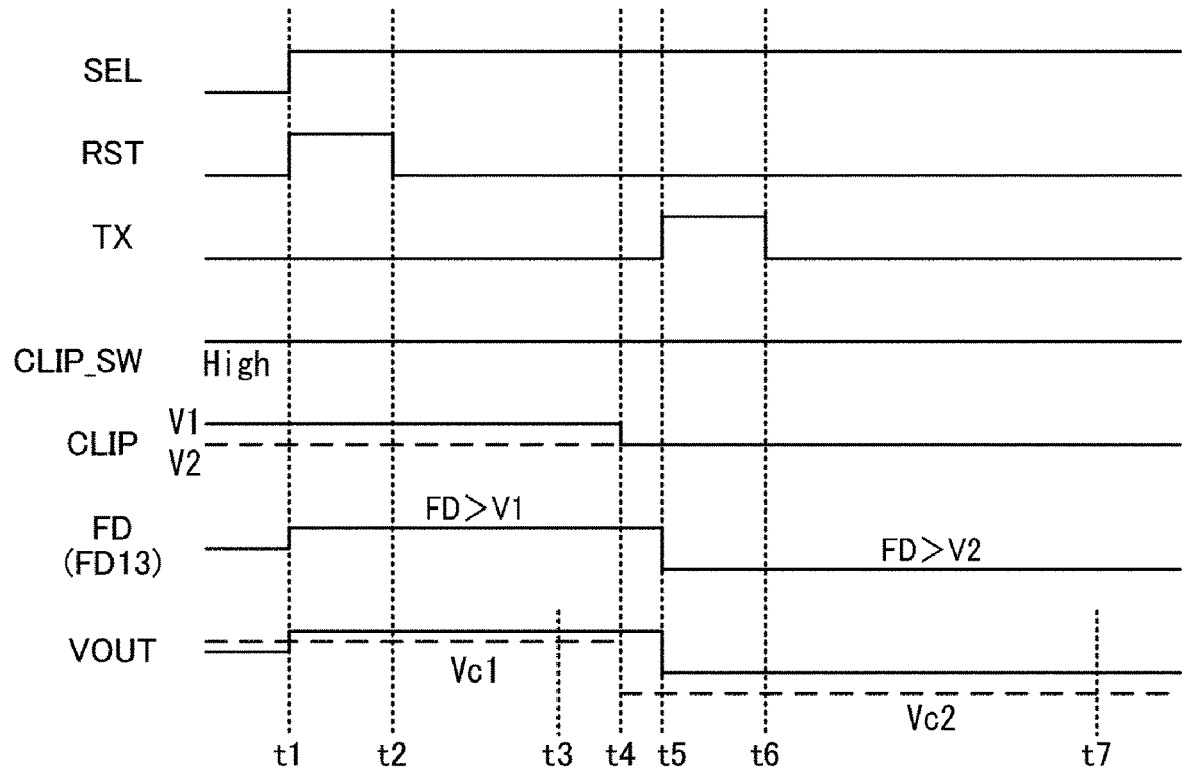
FIG. 5 is a timing chart illustrating of an operation example of the imaging element according to the first embodiment.
Figure 6:
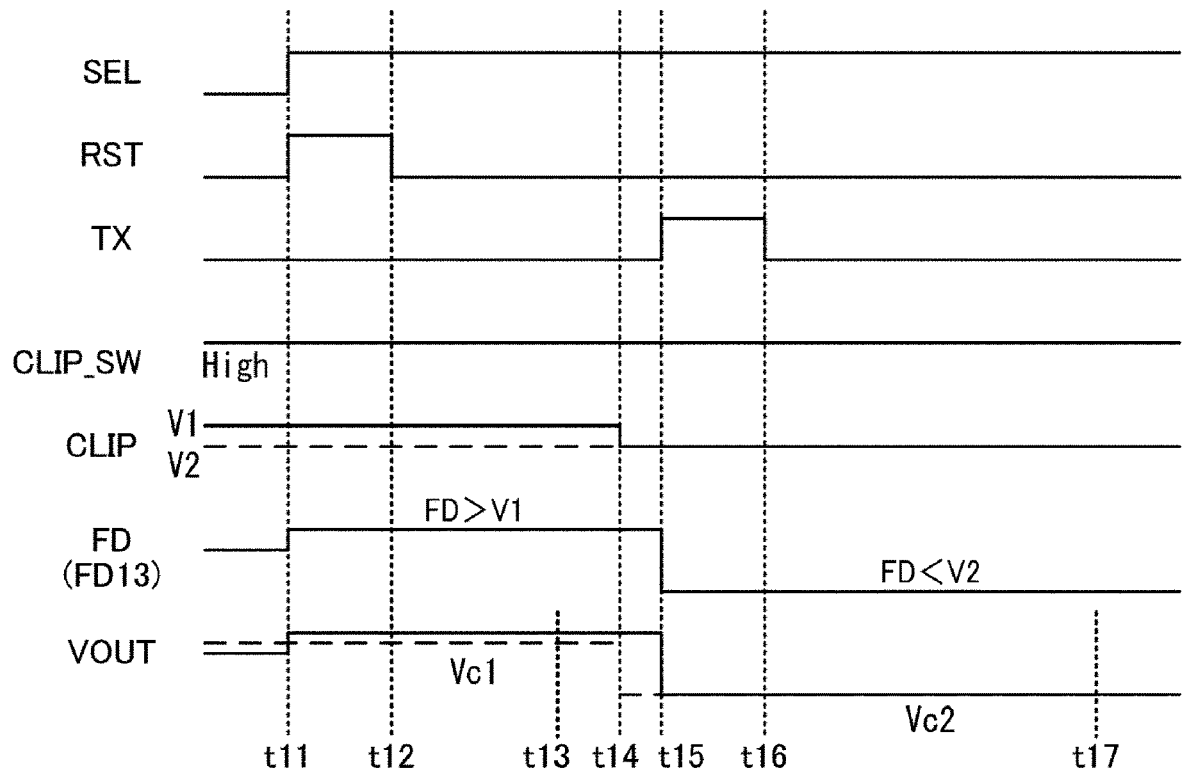
FIG. 6 is a timing chart illustrating an operation example of the imaging element according to the first embodiment.

FIGS. 5 and 6 are timing charts illustrating operation examples of the imaging element 3 according to the first embodiment. In the timing charts shown in FIGS. 5 and 6, the vertical axis indicates the voltage level of a signal, and the horizontal axis indicates time. FD indicates a signal (voltage signal) of the FD 13, and VOUT indicates a signal which is output to the signal line 22. In the examples shown in FIGS. 5 and 6, the signal CLIP_SW is set to a high level, and the switch unit 32 of the supply unit 30 enters an on state. In FIG. 5 and FIG. 6, a transistor to which control signals (the signal SEL, the signal RST, and the signal TX) of a high level (for example, the power supply voltage VDD) are input enters an on state, and a transistor to which a control signal of a low level (for example, a ground voltage) is input enters an off state.

At time t1 shown in FIG. 5, the signal RST is set to a high level, so that the transistor M2 of the reset unit 14 of the pixel 10 enters an on state, and the FD 13 and the power supply line 121 are electrically connected to each other. Thereby, the electric charges of the FD 13 are reset, and the voltage of the FD 13 is set to a reset voltage. In addition, at time t1, the signal SEL is set to a high level, so that the transistor M4 of the selection unit 16 enters an on state. Thereby, the amplification unit 15 and the selection unit 16 can output a signal based on the reset voltage of the pixel 10, that is, a signal after the electric charges of the FD 13 of the pixel 10 are reset, to the signal line 22. At time t2, the signal RST is set to a low level, so that the transistor M2 of the reset unit 14 enters an off state.

The signal output unit 31 of the supply unit 30 is in a state in which the signal CLIP of the first voltage V1 is input and a voltage based on the first voltage V1 (a clip voltage Vc1 shown by the broken line in FIG. 5) can be supplied to the signal line 22. In the example shown in FIG. 5, in the period from time t2 to time t3, the voltage of the FD 13 (the voltage of the FD shown in FIG. 5) is higher than the first voltage V1 which is the voltage of the signal CLIP. Therefore, the voltage of the signal VOUT which is output to the signal line 22 is set to a voltage based on the voltage of the FD 13, that is, a voltage based on a reset voltage after the electric charges accumulated in the FD 13 are reset.

At time t3, the processing unit 50 of the readout unit 60 samples the signal VOUT which is a voltage based on the reset voltage as the dark signal. It can be said that the voltage of the dark signal is fixed at time t3. The AD conversion unit 40 of the processing unit 50 converts the dark signal into a digital signal. At time t4, the signal CLIP of the second voltage V2 lower than the first voltage V1 is input to the signal output unit 31. The voltage of the signal CLIP changes from the first voltage V1 to the second voltage V2, and the signal output unit 31 is in a state in which a voltage based on the second voltage V2 (a clip voltage Vc2 shown by the broken line in FIG. 5) can be supplied to the signal line 22.

At time t5, the signal TX is set to a high level, so that the transistor M1 of the transfer unit 12 enters an on state, and the electric charges photoelectrically converted by the photoelectric conversion unit 11 are transferred to the FD 13. Thereby, the voltage of the FD 13 is set to a voltage based on the electric charges transferred from the photoelectric conversion unit 11. In addition, since the signal SEL is at a high level, the amplification unit 15 and the selection unit 16 are in a state in which a signal based on the electric charges generated by the photoelectric conversion unit 11 can be output the signal line 22. At time t6, the signal TX is set to a low level, so that the transistor M1 of the transfer unit 12 enters an off state.

In the example shown in FIG. 5, in the period from time t6 to time t7, the voltage of the FD 13 is higher than the second voltage V2 which is the voltage of the signal CLIP. Therefore, the voltage of the signal VOUT which is output to the signal line 22 is set to a voltage based on the voltage of the FD 13, that is, a voltage based on the electric charges photoelectrically converted by the photoelectric conversion unit 11.

At time t7, the processing unit 50 samples the signal VOUT which is a voltage based on the electric charges photoelectrically converted by the photoelectric conversion unit 11 as the photoelectric conversion signal. It can be said that the voltage of the photoelectric conversion signal is fixed at time t7. The AD conversion unit 40 of the processing unit 50 converts the photoelectric conversion signal into a digital signal. The processing unit 50 performs CDS for performing difference processing between the dark signal and the photoelectric conversion signal with respect to the dark signal and the photoelectric conversion signal converted into a digital signal. The processing unit 50 performs signal processing such as CDS processing and then outputs the processed signal to the control unit 4.

Next, another example of the operation of the imaging element 3 will be described with reference to FIG. 6. At time t11 shown in FIG. 6, the signal RST is set to a high level, so that the transistor M2 of the reset unit 14 of the pixel 10 enters an on state. Thereby, the electric charges of the FD 13 are reset, and the voltage of the FD 13 is set to a reset voltage. In addition, at time t11, the signal SEL is set to a high level, so that the transistor M4 of the selection unit 16 enters an on state. Thereby, the amplification unit 15 and the selection unit 16 can output a signal based on the reset voltage of the pixel 10 to the signal line 22. At time t12, the signal RST is set to a low level, so that the transistor M2 of the reset unit 14 enters an off state.

The signal output unit 31 of the supply unit 30 is in a state in which the signal CLIP of the first voltage V1 is input and the voltage based on the first voltage V1 (the clip voltage Vc1) can be supplied to the signal line 22. In the example shown in FIG. 6, in the period from time t12 to time t13, the voltage of the FD 13 is higher than the first voltage V1 which is the voltage of the signal CLIP. Therefore, the voltage of the signal VOUT which is output to the signal line 22 is set to a voltage based on the reset voltage of the FD 13.

At time t13, the processing unit 50 of the readout unit 60 samples the signal VOUT which is a voltage based on the reset voltage as the dark signal. The processing unit 50 converts the dark signal into a digital signal. At time t14, the signal output unit 31 is in a state in which the signal CLIP of the second voltage V2 lower than the first voltage V1 is input and the voltage based on the second voltage V2 (the clip voltage Vc2) can be supplied to the signal line 22.

At time t15, the signal TX is set to a high level, so that the transistor M1 of the transfer unit 12 enters an on state, and the electric charges photoelectrically converted by the photoelectric conversion unit 11 are transferred to the FD 13. Thereby, the voltage of the FD 13 is set to a voltage based on the electric charges transferred from the photoelectric conversion unit 11. In addition, since the signal SEL is at a high level, the amplification unit 15 and the selection unit 16 are in a state in which a signal based on the electric charges generated by the photoelectric conversion unit 11 can be output to the signal line 22. At time t16, the signal TX is set to a low level, so that the transistor M1 of the transfer unit 12 enters an off state.

In the example shown in FIG. 6, in the period from time t16 to time t17, the voltage of the FD 13 is lower than the second voltage V2 which is the voltage of the signal CLIP. Therefore, the voltage of the signal VOUT which is output to the signal line 22 is limited to the voltage based on the second voltage V2, that is, the clip voltage Vc2.

At time t17, the processing unit 50 samples the signal VOUT which is the clip voltage Vc2 as the photoelectric conversion signal. The processing unit 50 converts the photoelectric conversion signal into a digital signal. The processing unit 50 performs signal processing such as CDS processing using the dark signal and the photoelectric conversion signal converted into a digital signal, and then outputs the processed signal to the control unit 4. In this way, in the present embodiment, the signals CLIP having signal levels different from each other are input to the supply unit 30 in a case where the dark signal is read out and a case where the photoelectric conversion signal is read out. The supply unit 30 can limit the voltage of the signal line 22 by supplying a voltage to the signal line 22 in accordance with the voltage of the signal CLIP and the voltage of the FD 13.

As shown in FIG. 4, the gate of the transistor M5 of each current source 25 provided for each signal line 22 is commonly connected to a signal line to which the signal VB is input. In addition, a parasitic capacitance (load capacity) may be added between the signal line 22 to which the pixel signal is output and the gate of the transistor M5 connected to the signal line 22. Because of the influence of this parasitic capacitance, the voltage of the signal VB may fluctuate due to a fluctuation in the voltage of the signal line 22, and the magnitude of a current flowing through each current source 25 may fluctuate. In a case where the imaging element 3 does not have the supply unit 30, it is conceivable that the voltage of the signal line 22 is greatly reduced and the voltage of the signal VB is also greatly reduced, so that a current supplied from the current source 25 is reduce or a current is not supplied from the current source 25. In a case where the voltage of the signal line 22 provided for a certain pixel block 20 fluctuates, the voltage of the signal line 22 provided for another pixel block 20 also fluctuates due to a fluctuation in the voltage of the signal VB which is commonly supplied to each current source 25.

On the other hand, the imaging element 3 according to the present embodiment is provided with the supply unit 30 for each pixel block 20. The supply unit 30 can supply a voltage based on the signal CLIP to the signal line 22 in a case where the switch unit 32 is in an on state, and can limit the voltage of the signal line 22. Therefore, the imaging element 3 can suppress a fluctuation in the voltage of the signal VB by limiting the voltage of the signal line 22. This makes it possible to prevent noise caused by a fluctuation in the voltage of the signal VB from being mixed in the signal (the photoelectric conversion signal or the dark signal) which is output to the signal line 22.

In the present embodiment, an operation (clip operation) in which the voltage of the signal line 22 is limited is performed in a case where the voltage of the FD 13 is relatively low, and the clip operation is not performed in a case where the voltage of the FD 13 is relatively high. When the clip operation is performed and when the clip operation is not performed, a path through which a current flows due to the current source 25 changes as described above. In a case where the clip operation is performed, the current of the current source 25 flows between the power supply line 122 and a wiring (grounding line) 131 shown in FIG. 4 through the signal output unit 31 of the supply unit 30. In a case where the clip operation is not performed, the current of the current source 25 flows between the power supply line 121 and the grounding line (ground wiring) 131 through the amplification unit 15 of the pixel 10. Since wiring resistance is added to the power supply line 121, the power supply line 122, and the grounding line 131 as schematically shown in FIG. 4, a voltage drop (IR drop) caused by the wiring resistance occurs.

Due to the influence of a change in the current path described above, the amount of voltage drop in the power supply line 121, the power supply line 122, and the grounding line 131 changes in a case where the clip operation is performed and a case where the clip operation is not performed, and a difference may occur in the value of the power supply voltage VDD which is imparted to each pixel 10 through the power supply line 121. In a case where signals are simultaneously read out from a plurality of pixel blocks 20, a difference caused by a fluctuation in the power supply voltage VDD occurs in the pixel signal in the pixel block 20 in which the clip operation is performed in another pixel block 20 while the signal is being read out and the pixel block 20 in which the clip operation is not performed in another pixel block 20 while the signal is being read out. In addition, in a case where a fluctuation in the power supply voltage VDD occurs when the photoelectric conversion signal is read out, the signal level of the reset voltage of the FD 13, that is, the signal level serving as a reference for the voltage change occurring in accordance with the electric charges transferred from the photoelectric conversion unit 11, may fluctuate. In a case where a difference occurs in the signal level of the reset voltage between a period in which the dark signal is read out and a period in which the photoelectric conversion signal is read out, CDS processing is performed using a dark signal having a signal level different from the signal level to be used as a reference for the photoelectric conversion signal, and blackening or streaking, for example, occurs in an image generated using the signal after CDS processing. Particularly, in a case where the power supply voltage is supplied to the pixel 10 and the supply unit 30 from different electrodes through different power supply lines, it is considered that a difference in the value of the power supply voltage supplied to the pixel 10 between a case where the clip operation is performed and a case where the clip operation is not performed becomes large.

In the present embodiment, the pixel 10 and the supply unit 30 are connected to the common electrode 200. In addition, since the power supply line 121 and the power supply line 122 are connected to each other by a plurality of wirings 126, it is possible to reduce the resistance value of a path from the electrode 200 to the pixel 10 and the supply unit 30. This makes it possible to reduce a difference in the power supply voltage VDD applied to the pixel 10 in a case where the clip operation is performed and a case where the clip operation is not performed. Therefore, it is possible to prevent a difference caused by a fluctuation in the power supply voltage from occurring in the signal of each pixel. As a result, it is possible to prevent blacking or streaking from occurring in an image generated using the pixel signal.

In the imaging element 3 according to the present embodiment, the supply unit 30 is disposed in the second substrate 112. Therefore, it is possible to increase the light-receiving area of the photoelectric conversion unit 11 as compared with a case where the supply unit 30 is provided in the first substrate 111. It is possible to prevent the aperture ratio of a pixel from decreasing. In addition, it is possible to perform the clip operation without increasing the chip area, and to prevent the quality of an image generated using the pixel signal from being deteriorated. In addition, in the present embodiment, the supply control unit 36 is disposed in the second substrate 112. Since the supply unit 30 and the supply control unit 36 are provided in the same substrate, the supply unit 30 is likely to be controlled.

Figure 7:
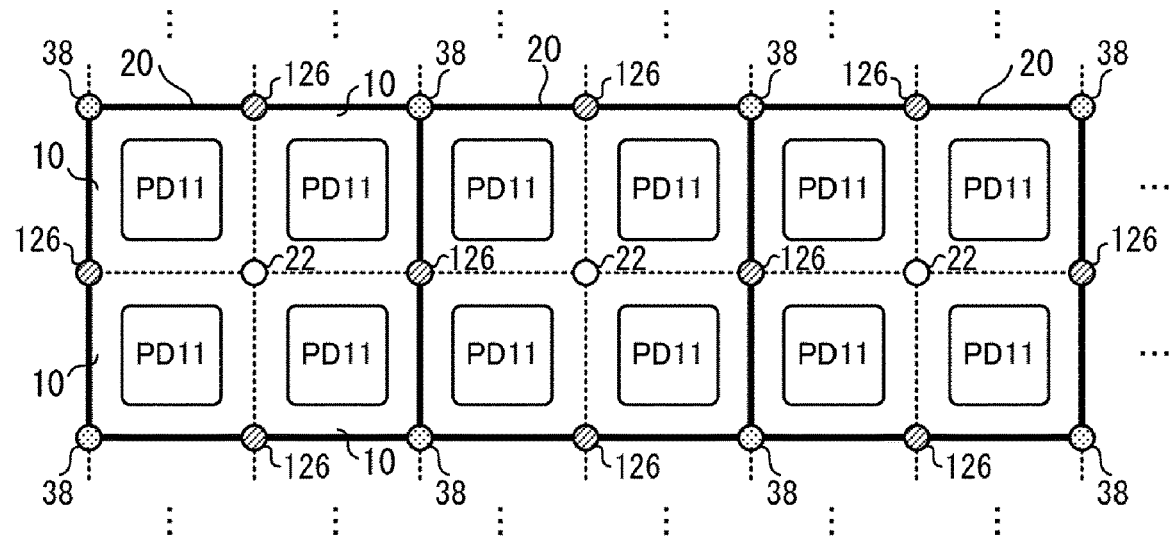
FIG. 7 is a diagram illustrating an example of a layout of a portion of the imaging element according to the first embodiment.
Figure 7:
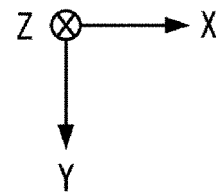

FIG. 7 is a diagram illustrating an example of a layout of a portion of the imaging element according to the first embodiment. In each of the plurality of pixel blocks 20 of the imaging element 3, a plurality of pixels 10 including the photoelectric conversion unit 11 are disposed in a row direction (X direction) which is a first direction and a column direction (Y direction) which is a second direction intersecting the first direction. In the example shown in FIG. 7, the pixel block 20 is provided with four pixels 10. In the first substrate 111 of the imaging element 3, a plurality of pixel blocks 20 including four pixels 10 are disposed in a row direction (horizontal direction) and a column direction (vertical direction). Meanwhile, FIG. 7 schematically shows some wirings provided in the imaging element 3.

The signal line 22 provided for each pixel block 20 is connected to each of the four pixels 10 within the pixel block 20 and transmits the pixel signal to the processing unit 50. The wiring 126 is provided between the signal lines 22 which are adjacent to each other. The wiring 126 is provided with the power supply voltage VDD as described above, and functions as a shield by being provided so as to interpose the signal line 22. It is possible to prevent coupling between the signal lines 22, and to prevent noise from being mixed in the pixel signal which is output to the signal lines 22.

A plurality of wirings 38 shown in FIG. 7 schematically represent a plurality of wirings (control lines) for transmitting the signal TX, the signal RST, and the signal SEL described above. In a case where the pixel control unit 35 that supplies the signal TX or the like is disposed in the second substrate 112, the control line 38 may be disposed at a corner (diagonal corner) of the pixel block 20 as shown in FIG. 7. In this case, since the control line 38 is disposed separately from the signal line 22, it is possible to prevent noise caused by the signals of the control line 38 (such as the signal TX, the signal RST, and the signal SEL) from influencing the signal line 22.

According to the above-described embodiment, the following operational effects can be obtained.

(1) The imaging element 3 includes the first substrate 111 provided with the photoelectric conversion unit 11 configured to generate electric charges by photoelectric conversion and the signal line 22 to which a signal based on the electric charges generated by the photoelectric conversion unit 11 is output, and the second substrate 112 provided with the supply unit 30 configured to supply a voltage to the signal line 22 and the processing unit 50 configured to process a signal output to the signal line 22, the second substrate being stacked on the first substrate 111. In the present embodiment, the pixel 10 having the photoelectric conversion unit 11 is disposed in the first substrate 111, and the supply unit 30 is disposed in the second substrate 112. Therefore, it is possible to perform the clip operation without increasing the chip area, and to prevent the quality of the pixel signal from being deteriorated. Thereby, it is possible to prevent the quality of an image generated using the pixel signal from being deteriorated. It is possible to increase the light-receiving area of the photoelectric conversion unit 11 as compared with a case where the supply unit 30 is provided in the first substrate 111, and to prevent the aperture ratio of a pixel from decreasing.

(2) In the present embodiment, the readout unit 60 having a plurality of the processing units 50 is disposed in the second substrate 112. Therefore, it is possible to dispose a plurality of circuits for processing pixel signals without increasing the chip area. In addition, it is possible to prevent the aperture ratio of a pixel from decreasing.

The following modifications are also within the scope of the present invention, and one or a plurality of modification examples can be combined with the above-described embodiment.

Modification Example 1

In the above-described embodiment, although an example in which the supply unit 30 has the signal output unit 31 and the switch unit 32 has been described, the configuration of the supply unit 30 is not limited thereto. The supply unit 30 may be configured not to have the switch unit 32. The signal output unit 31 is electrically connected to the signal line 22 without going through the switch unit 32, and can supply a voltage to the signal line 22 both in a case where the dark signal is read out and in a case where the photoelectric conversion signal is read out. In the present modification example, it is possible to reduce the switch unit 32, and to reduce the chip area.

Modification Example 2

The signal output unit 31 may be provided for each pixel 10. For example, in a case where the pixel block 20 is constituted by four pixels 10, four signal output units 31 and four switch units 32 may be disposed for each pixel block 20. Meanwhile, only the signal output unit 31 out of the signal output unit 31 and the switch unit 32 may be disposed for each pixel 10, and the switch unit 32 may not be disposed.

The signal CLIP may be supplied for each signal output unit 31 or for each of a plurality of signal output units 31 using separate wirings. In this case, it is possible to reduce the number of signal output units 31 connected to one wiring, and to switch the signal level of the signal CLIP at a high speed.

Modification Example 3

In the above-described embodiment, an example in which the signal line 22 and the supply unit 30 are provided for each pixel block 20 has been described. However, the signal line 22 may be disposed for each pixel 10, and the supply unit 30 may be dispose for each signal line 22. In this case, the pixel control unit 35 may be disposed for each pixel 10, and the supply control unit 36 may be disposed for each supply unit 30. Each supply control unit 36 may control the supply unit 30 provided for each signal line 22 so that a voltage can be supplied to each signal line 22 at different timings.

Modification Example 4

Figure 8:
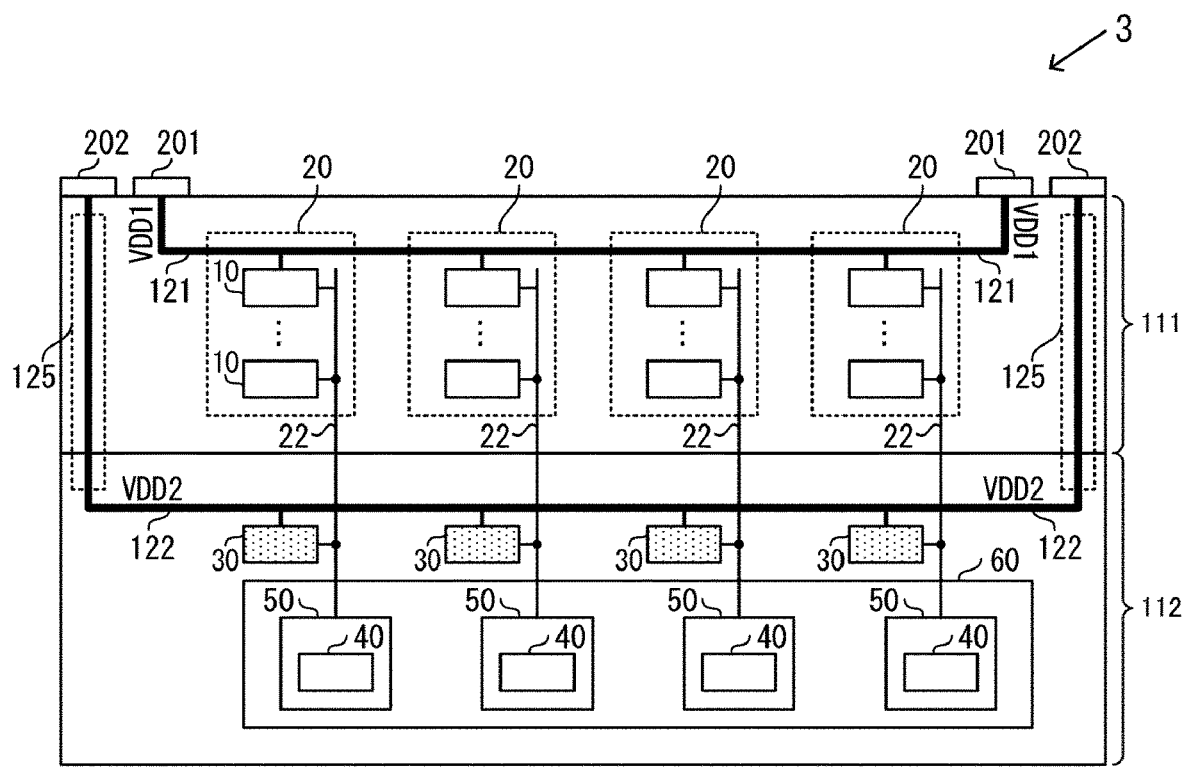
FIG. 8 is a block diagram illustrating an example of a configuration of an imaging element according to a modification example.

FIG. 8 is a block diagram illustrating a configuration example of an imaging element according to Modification example 4. As shown in FIG. 8, a power supply voltage may be supplied to the pixel 10 and the supply unit 30 from separate electrodes. In the example shown in FIG. 8, a power supply voltage VDD1 is supplied from an electrode 201 through the power supply line 121 to the pixel 10, and a power supply voltage VDD2 is supplied from an electrode 202 through the power supply line 122 to the supply unit 30. The power supply line 121 and the power supply line 122 may be formed so that the resistance value of a path from the electrode 201 to each pixel 10 and the resistance value of a path from the electrode 202 to each supply unit 30 are the same as each other. Meanwhile, the power supply voltage VDD1 and the power supply voltage VDD2 may have different values, and, for example, the power supply voltage VDD2 may be a voltage lower than the voltage VDD1. In this case, the supply unit 30 can be operated by the power supply voltage VDD2 lower than the power supply voltage VDD1 which is supplied to the pixel 10. It is possible to reduce power consumption of the imaging element 3.

Modification Example 5

Figure 9:
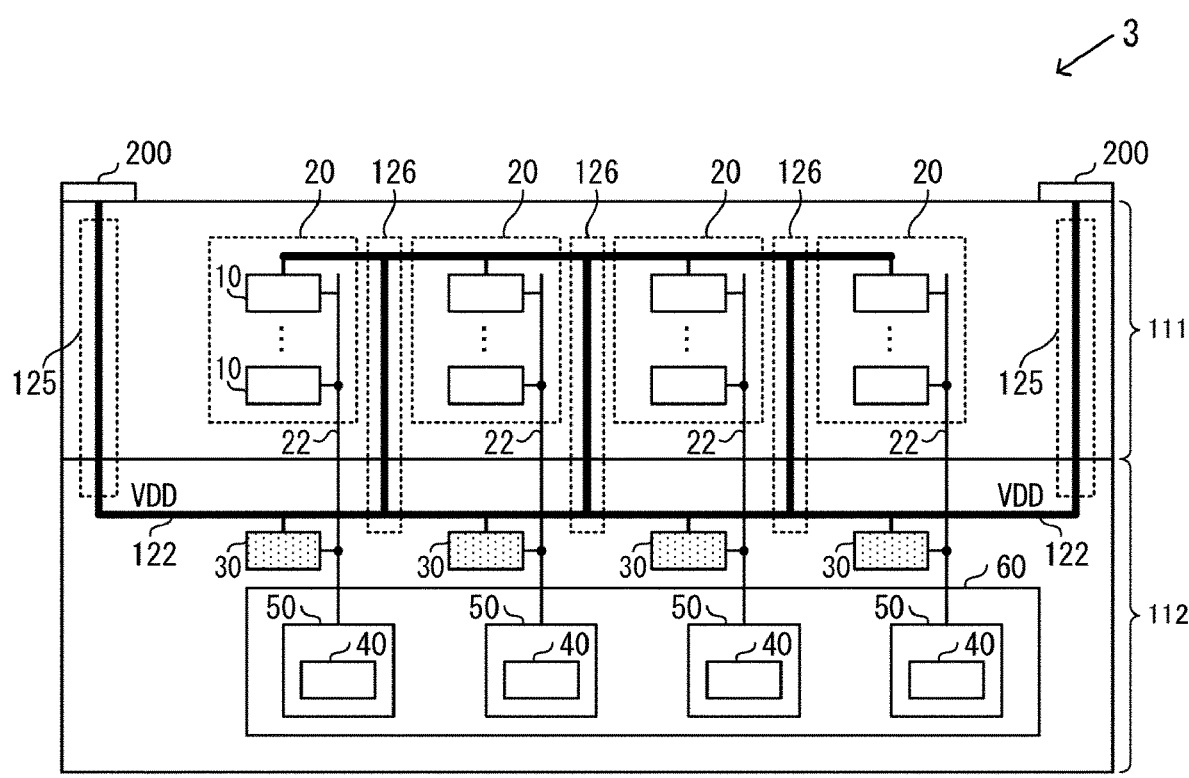
FIG. 9 is a block diagram illustrating another example of a configuration of the imaging element according to the modification example.

FIG. 9 is a block diagram illustrating a configuration example of an imaging element according to Modification example 5. As shown in FIG. 9, the power supply line 121 for connecting the electrode 200 and each pixel 10 may not be provided in the first substrate 111. In this case, the power supply voltage VDD is supplied from the electrode 200 through the power supply line 122 and the wiring 126 to each pixel 10. In the present modification example, it is possible to reduce the number of wirings which are disposed in the first substrate 111.

Modification Example 6

The pixel 10 and the supply unit 30 may be configured using an NMOS transistor or may be configured using a PMOS transistor. The pixel 10 and the supply unit 30 may be configured using both an NMOS transistor and a PMOS transistor. When the photoelectric conversion signal is read out in a case where the amplification unit 15 and the signal output unit 31 are constituted by an NMOS transistor, as described above, the signal CLIP having a voltage lower than that when the dark signal is read out may be supplied to the signal output unit 31. When the photoelectric conversion signal is read out in a case where the amplification unit 15 and the signal output unit 31 are constituted by a PMOS transistor, the signal CLIP having a voltage higher than that when the dark signal is read out may be supplied to the signal output unit 31. The supply unit 30 supplies a voltage to the signal line 22 so that the voltage of the signal line 22 is set to a value from the power supply voltage (or the ground voltage) to the voltage based on the signal CLIP. The voltage of the signal line 22 is limited by the supply unit 30 so as to be a value within a range in which the voltage based on the signal CLIP is set to an upper limit or a lower limit.

Modification Example 7

In the above-described embodiment, an example in which the imaging element 3 is configured by stacking the first substrate 111 and the second substrate 112 has been described. However, the first substrate 111 and the second substrate 112 may not be stacked.

Modification Example 8

In the above-described embodiment, an example in which the imaging element 3 has a back-side illuminated configuration will be described. However, the imaging element 3 may have a front-side illuminated configuration in which the wiring layer 101 is provided on the incident surface side on which light is incident.

Modification Example 9

In the embodiment and the modification examples described above, an example in which a photodiode is used as the photoelectric conversion unit has been described. However, a photoelectric conversion film (organic photoelectric film) may be used as the photoelectric conversion unit.

Modification Example 10

The imaging element and the imaging device described in the embodiment and the modification examples described above may be applied to a camera, a smartphone, a tablet, a camera built into a PC, an in-vehicle camera, a camera mounted on an unmanned aerial vehicle (such as a drone or a radio control machine), and the like.

Although various embodiments and modification examples have been described above, the present invention is not limited to the above-described content. Other aspects that can be considered to fall within the technical idea of the present invention are also included in the scope of the present invention.

Priority is claimed on Japanese Patent Application No. 2019-180781, filed Sep. 30, 2019, the content of which is incorporated herein by reference.

REFERENCE SIGNS LIST

1 Imaging device
3 Imaging element
4 Control unit
10 Pixel
11 Photoelectric conversion unit
20 Pixel block
30 Supply unit
35 Pixel control unit
36 Supply control unit
40 AD conversion unit
50 Processing unit
60 Readout unit
70 Readout control unit
111 First substrate
112 Second substrate

The invention claimed is:
1. An imaging element comprising:
a first substrate on which are located a first pixel including a first photoelectric converter that converts light into an electric charge;
a second pixel including a second photoelectric converter that converts light into an electric charge and is arranged in line with the first photoelectric converter in a row direction; and
a third pixel including a third photoelectric converter that converts light into an electric charge and is arranged in line with the first photoelectric converter in a column direction;
a wiring layer in which are located
a first signal line that is electrically connected to the first pixel and to which a first signal is output based on the electric charge converted in the first photoelectric converter;
a second signal line that is electrically connected to the second pixel and to which a second signal is output based on the electric charge converted in the second photoelectric converter; and
a third signal line that is electrically connected to the third pixel and to which a third signal is output based on the electric charge converted in the third photoelectric converter; and
a second substrate that is stacked together with the first substrate and on which are located
a first supply unit that supplies a first voltage to the first signal line;
a second supply unit that supplies a second voltage to the second signal line;
a third supply unit that supplies a third voltage to the third signal line;
a first processing unit that performs signal processing on the first signal output to the first signal line;
a second processing unit that performs signal processing on the second signal output to the second signal line;
a third processing unit that performs signal processing on the third signal output to the third signal line;
a first pixel controller for reading out the first signal from the first pixel to the first signal line;
a second pixel controller for reading out the second signal from the second pixel to the second signal line;
a third pixel controller for reading out the third signal from the third pixel to the third signal line;
a first control unit that controls such that the first voltage is supplied from the first supply unit to the first signal line when the first signal is read out from the first pixel to the first signal line by the first pixel controller;
a second control unit that controls such that the second voltage is supplied from the second supply unit to the second signal line when the second signal is read out from the second pixel to the second signal line by the second pixel controller; and
a third control unit that controls such that the third voltage is supplied from the third supply unit to the third signal line when the third signal is read out from the third pixel to the third signal line by the third pixel controller, wherein
the wiring layer is located between the first substrate and the second substrate in a stacking direction in which the first substrate and the second substrate are stacked.

2. The imaging element according to claim 1, wherein:
the first pixel controller reads out a first dark signal from the first pixel to the first signal line for removing noise included in the first signal;
the second pixel controller reads out a second dark signal from the second pixel to the second signal line for removing noise included in the second signal;
the third pixel controller reads out a third dark signal from the third pixel to the third signal line for removing noise included in the third signal;
the first control unit controls such that a fourth voltage different from the first voltage is supplied from the first supply unit to the first signal line when the first dark signal is read out from the first pixel to the first signal line by the first pixel controller;
the second control unit controls such that a fifth voltage different from the second voltage is supplied from the second supply unit to the second signal line when the second dark signal is read out from the second pixel to the second signal line by the second pixel controller; and
the third control unit controls such that a sixth voltage different from the third voltage is supplied from the third supply unit to the third signal line when the third dark signal is read out from the third pixel to the third signal line by the third pixel controller.

3. The imaging element according to claim 2, wherein:
the first control unit controls such that the first voltage, which is lower than the fourth voltage, is supplied from the first supply unit to the first signal line when the first signal is read out from the first pixel to the first signal line by the first pixel controller;
the second control unit controls such that the second voltage, which is lower than the fifth voltage, is supplied from the second supply unit to the second signal line when the second signal is read out from the second pixel to the second signal line by the second pixel controller; and
the third control unit controls such that the third voltage, which is lower than the sixth voltage, is supplied from the third supply unit to the third signal line when the third signal is read out from the third pixel to the third signal line by the third pixel controller.

4. The imaging element according to claim 1, wherein:
the first substrate is provided with a fourth pixel including a fourth photoelectric converter that converts light into an electric charge and is arranged adjacent to the first photoelectric converter in the row direction;
the first signal line is electrically connected to the fourth pixel and has output thereto a fourth signal that is based on the electric charge converted in the fourth photoelectric converter;
the first processing unit performs signal processing on the fourth signal output to the first signal line; and
the first pixel controller reads out the fourth signal from the fourth pixel to the first signal line.

5. The imaging element according to claim 4, wherein
the first control unit controls such that the first voltage is supplied from the first supply unit to the first signal line when the fourth signal is read out from the fourth pixel to the first signal line by the first pixel controller.

6. The imaging element according to claim 4, wherein:
the first substrate is provided with a fifth pixel including a fifth photoelectric converter that converts light into an electric charge and is arranged adjacent to the second photoelectric converter in the row direction;
the second signal line is electrically connected to the fifth pixel and has output thereto a fifth signal that is based on the electric charge converted in the fifth photoelectric converter;

the second processing unit performs signal processing on the fifth signal output to the second signal line; and the second pixel controller reads out the fifth signal from the fifth pixel to the second signal line.

7. The imaging element according to claim 6, wherein the second control unit controls such that the second voltage is supplied from the second supply unit to the second signal line when the fifth signal is read out from the fifth pixel to the second signal line by the second pixel controller.

8. The imaging element according to claim 6, wherein:

the first substrate is provided with a sixth pixel including a sixth photoelectric converter that converts light into an electric charge and is arranged adjacent to the third photoelectric converter in the row direction;

the third signal line is electrically connected to the sixth pixel and has output thereto a sixth signal that is based on the electric charge converted in the sixth photoelectric converter;

the third processing unit performs signal processing on the sixth signal output to the third signal line; and the third pixel controller reads out the sixth signal from the sixth pixel to the third signal line.

9. The imaging element according to claim 8, wherein the third control unit controls such that the third voltage is supplied from the third supply unit to the third signal line when the sixth signal is read out from the sixth pixel to the third signal line by the third pixel controller.

10. The imaging element according to claim 1, further comprising:

an electrode provided in the first substrate and to which a power supply voltage is supplied, wherein the first supply unit and the second supply unit are electrically connected to the electrode.

11. The imaging element according to claim 10, wherein the first wiring is configured to penetrate through the first substrate, and the first supply unit and the second supply unit are connected to the electrode through the first wiring.

12. The imaging element according to claim 1, wherein:

the first processing unit has a first converter that converts the first signal output to the first signal line into a digital signal;

the second processing unit has a second converter that converts the second signal output to the second signal line into a digital signal; and the third processing unit has a third converter that converts the third signal output to the third signal line into a digital signal.

13. The imaging element according to claim 1, wherein the second pixel controller controls such that an accumulation time of the electric charge converted in the second photoelectric converter is different from an accumulation time of the electric charge converted in the first photoelectric converter.

14. The imaging element according to claim 1, wherein the third pixel controller controls such that an accumulation time of the electric charge converted in the third photoelectric converter is different from an accumulation time of the electric charge converted in the first photoelectric converter.

15. The imaging element according to claim 1, wherein a timing at which the second signal is read out from the second pixel to the second signal line by the second pixel controller is different from a timing at which the first signal is read out from the first pixel to the first signal line by the first pixel controller.

16. The imaging element according to claim 15, wherein the second pixel controller controls such that an accumulation time of the electric charge converted in the second photoelectric converter is different from an accumulation time of the electric charge converted in the first photoelectric converter.

17. The imaging element according to claim 1, wherein a timing at which the third signal is read out from the third pixel to the third signal line by the third pixel controller is different from a timing at which the first signal is read out from the first pixel to the first signal line by the first pixel controller.

18. The imaging element according to claim 17, wherein the third pixel controller controls such that an accumulation time of the electric charge converted in the third photoelectric converter is different from an accumulation time of the electric charge converted in the first photoelectric converter.

19. An imaging device comprising:

the imaging element according to claim 1; and a generation unit that generates image data based on the first signal on which signal processing has been performed in the first processing unit.

20. An imaging device comprising the imaging element according to claim 13.

21. An imaging device comprising the imaging element according to claim 7.

22. An imaging device comprising the imaging element according to claim 17.

* * * * *